(12) United States Patent
Vos et al.

(10) Patent No.: US 6,330,152 B1
(45) Date of Patent: Dec. 11, 2001

(54) APPARATUS FACILITATING USE OF COTS ELECTRONICS IN HARSH ENVIRONMENTS

(76) Inventors: David L. Vos, 3 Field Day Dr., Apalachin, NY (US) 13732; Ronald J. Feduke, 3636 Wildwood Dr.; Robert L. Jennings, 1026 Autumn Dr., both of Endwell, NY (US) 13760; Jan M. Nielsen, 419 Swan Hill Rd., Glen Aubrey, NY (US) 13777

( * ) Notice: Subject to any disclaimer, the term of this patent is extended or adjusted under 35 U.S.C. 154(b) by 0 days.

(21) Appl. No.: 09/590,209

(22) Filed: Jun. 8, 2000

(51) Int. Cl.$^7$ ................................ H05K 7/20; H05B 3/10
(52) U.S. Cl. ................ 361/688; 165/80.4; 165/61; 165/104.33; 62/259.2; 174/35 R; 174/52.1; 361/699; 361/695; 361/818; 219/209; 219/400; 219/553; 55/385.2
(58) Field of Search ..................... 165/61, 80.4, 103, 165/104.33, 104.34; 62/259.2; 174/35 R, 52.1; 312/236; 361/600, 679, 688, 694–695, 699, 724, 816, 818; 454/184; 55/385.2; 219/201, 209, 400, 553

(56) References Cited

U.S. PATENT DOCUMENTS

| | | | |
|---|---|---|---|
| 5,160,357 | * | 11/1992 | Faber .................................. 55/385.2 |
| 5,202,815 | * | 4/1993 | Le Boennec et al. ............. 174/35 R |
| 5,801,632 | * | 9/1998 | Opal .................................... 361/688 |
| 5,808,866 | * | 9/1998 | Porter .................................. 361/695 |
| 5,894,407 | * | 4/1999 | Aakalu et al. ...................... 361/695 |
| 6,127,663 | * | 10/2000 | Jones .................................. 219/553 |

* cited by examiner

Primary Examiner—Gregory Thompson

(57) ABSTRACT

An apparatus is provided for permitting commercial-off-the-shelf (COTS) electronics to be utilized in harsh environments for which the COTS electronics are not designed, including environments having ambient temperature variations, ambient pressure variations, shock and vibration exposure, environmental contaminants and/or electromagnetic radiation which may be beyond the design specification of the COTS components. The device includes a sealed enclosure having racks or other suitable mounts for the COTS components and having an environmental controlled unit (ECU) which circulates a fluid such as air through the enclosure and through the mounts. The temperature in the enclosure is monitored and the ECU operated to heat or cool fluid passing therethrough to maintain temperature in the enclosure within the design limits of the COTS electronics. A flow channel for ambient fluid, which channel is sealed from the internally circulating fluid, may be provided for removing heat from a cooling unit of the ECU. The enclosure may also have shock mounts, thermal insulation and appropriate shielding to deal with other environmental concerns.

30 Claims, 6 Drawing Sheets

APPARATUS FACILITATING USE OF COTS ELECTRONICS IN HARSH ENVIRONMENTS

FIELD OF THE INVENTION

This invention relates to apparatus for mounting electronic components, and more particularly to such apparatus which is capable of controlling the environment, including temperature, shock and vibration, environmental contaminants, and/or radiation, so as to permit commercial-off-the-shelf (COTS) electronics to be utilized in harsh environments for which such electronics are not designed.

BACKGROUND OF THE INVENTION

In various application, including military, space, commercial and recreational applications, there is a need to operate in harsh and hostile environments where ambient temperature may vary from for example −54° C. to +71° C., ambient pressures may vary from near vacuum condition in for example space applications to 30 psia (i.e. two atmospheres) for underwater applications, the vehicle or other container for the election components may experience significant shock and vibration, the environment may contain contaminants such as salt and various environmental pollutants and the environment may also contain various types of electromagnetic radiation. Such applications include military aircraft, including fixed wing and helicopters, commercial aircraft, space vehicles, military and commercial ships, various military and commercial land vehicles, temporary shelters, docks, offshore platforms, various unmanned remote monitoring stations and the like. Since COTS electronics is normally designed for operation in an office environment between +10° C. and +40°C., it has heretofore been possible to operate electronics in such environments only if the electronics is specially designed for such applications or is either individually packaged or packaged in small functional units designed for such applications. Since the cost of components specially designed for such application is high, few components are available which can operate in such environments and such components are typically far behind the current state of the art. Environmentally packaging components, or small groups of components, can also be expensive and results in a final product which is generally bulky, heavy and expensive. Such packaging may also have significant power requirements. Costs are further increased by the fact that it is frequently necessary to custom design the packaging or box for each unit being packaged.

A need therefore exists for a packaging technique which permits COTS electronics, including the most up-to-date, high performance COTS electronics, to be used in the various hostile environments indicated above without requiring customization of the electronic component itself or custom packaging for the components or units in which it is used, and which thus permits such components to be used in hostile environments at lower cost, with less added size and weight and with greater flexibility than is possible with existing environmental packaging techniques. Further reductions in cost, size, and weight may also be achieved by taking advantage of relaxed environmental specifications for some applications. For example, where the only environment for the application is a low temperature environment, operation in the range of −54° C. to +40° C. may be adequate, rather than requiring operation of up to +71° C.

SUMMARY OF THE INVENTION

In accordance with the above, this invention provides apparatus for permitting commercial-off-the-shelf (COTS) electronics to be utilized in harsh environments for which the COTS electronics are not designed, which apparatus includes an environmentally sealed enclosure; mounts in said enclosure for holding the COTS electronics; a temperature sensor within the enclosure; an environmental control unit (ECU) in said enclosure, said ECU including a cooler which, when operated. cools fluid passing thereover, a heater which, when operated, heats fluid passing thereover, and controls operative at least in part in response to said temperature sensor for selectively operating said cooler and said heater; and a mechanism for circulating fluid in said enclosure through said mounts and said ECU, the temperature of the fluid being appropriately controlled as it circulates through the ECU. The cooler is preferably a compressor, the enclosure including a channel sealed from the remainder of the enclosure through which ambient external fluid (generally air, or water, or two phase coolant) is circulated to cool the compressor. The walls of such channel may be formed of a corrosion-resistant material, as may the walls of the entire enclosure. The apparatus may include a mechanism which circulates air through the channel at least when the compressor is being operated, which mechanism may, but need not, be turned off when the heater is operated or when neither the heater nor the compressor are being operated. The channel may also be closed when the heater is operated to reduce heat loss.

The walls of the enclosure are preferably thermally insulated; the ECU and/or the mounts may also be thermally insulated. The apparatus may also include a mechanism for inhibiting vibration and/or shock for the COTS electronics. For example, an adapter plate may be provided for mounting the enclosure and the vibration inhibiting mechanism may include shock mounts between the adapter plate and the enclosure. Alternatively, the vibration inhibiting mechanism may include shock mounts between the mounts and the enclosure either in addition to or instead of shock mounts external to the enclosure. The enclosure must maintain structural integrity during shock impulses encountered during for example a crash for airborne applications to ensure the safety of the crew.

The enclosure may also have a removable panel through which access to the enclosure is provided, said panel being attached and sealed to the remainder of the enclosure when the apparatus is in use. This seal is preferably both an environmental and an electromagnetic seal.

The fluid circulating in the enclosure is normally a gas, for example air. A mechanism may be provided for removing moisture from the enclosure, which mechanism, for many embodiments, is operated at start-up or at other times when the system is off-line. Alternatively, a dry gas such as dry nitrogen, may be utilized as the recirculating gas to substantially eliminate moisture from the enclosure.

The apparatus may also be sealed to operated in an explosive environment, this generally involving hermetically sealing each element, such as switches, in the enclosure which might potentially generate a spark. The temperature sensor in the enclosure may include at least one on/off switch and preferably includes a first on/off switch for controlling the cooler and a second on/off switch for controlling the heater. The on/off switches may for example be bimetallic switches. Further, where the cooler utilizes a fluid refrigerant flowing through piping, such piping may also be hermetically sealed. particularly at its joints, to prevent leakage of the refrigerant into the enclosure.

The sealed enclosure may also be shielded and/or sealed to inhibit electromagnetic radiation passing therethrough in either direction, and may also include an RFI filter on the ECU and/or electronics. The ECU controls may also be operative for reducing power usage and/or acoustic noise. For preferred embodiments, the mounts are racks which are adapted for holding a plurality of COTS circuit boards.

The foregoing and other objects, features and advantages of the invention will be apparent from the following more particular description of preferred embodiments of the invention as illustrated in the accompanying drawings.

BRIEF DESCRIPTION OF THE DRAWINGS

The same reference numerals are used for common elements in the various figures.

DETAILED DESCRIPTION

Figure 1:
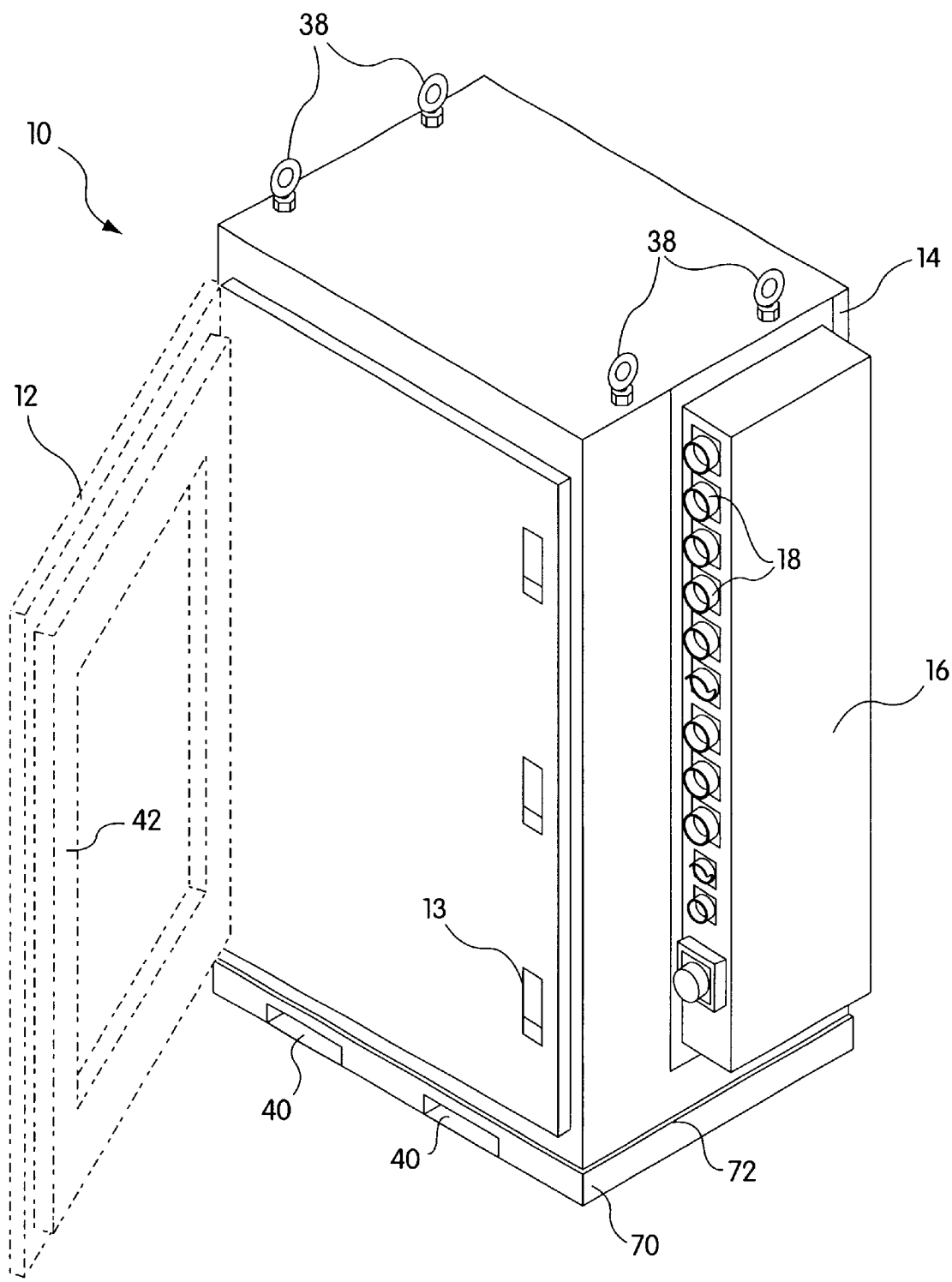
FIG. 1 is a front perspective view of an enclosure for COTS electronic components for an illustrative embodiment of the invention.
Figure 2:
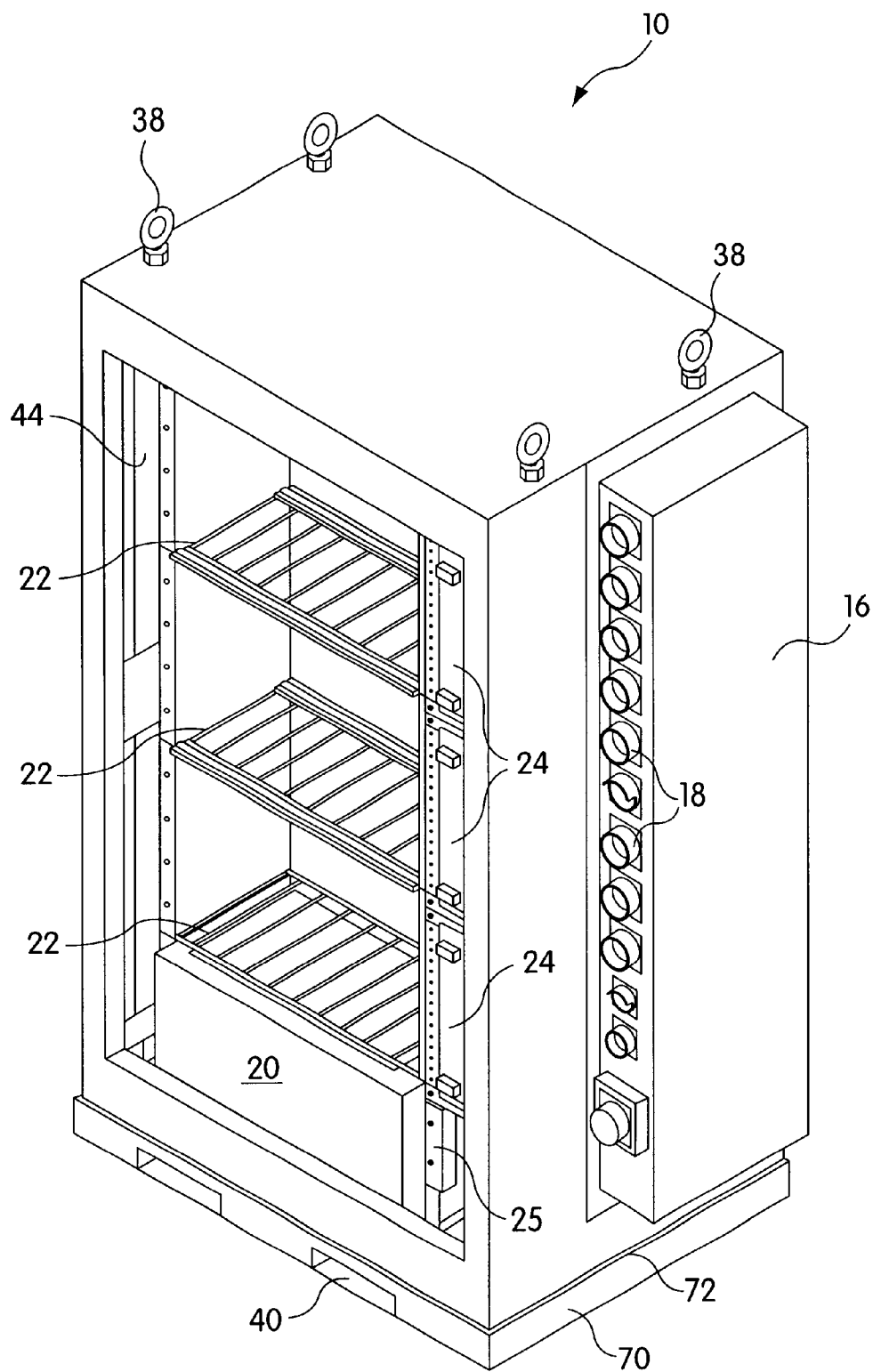
FIG. 2 is a front perspective view of the enclosure shown in FIG. 1 with the front door removed to expose the inside of the enclosure.
Figure 3:
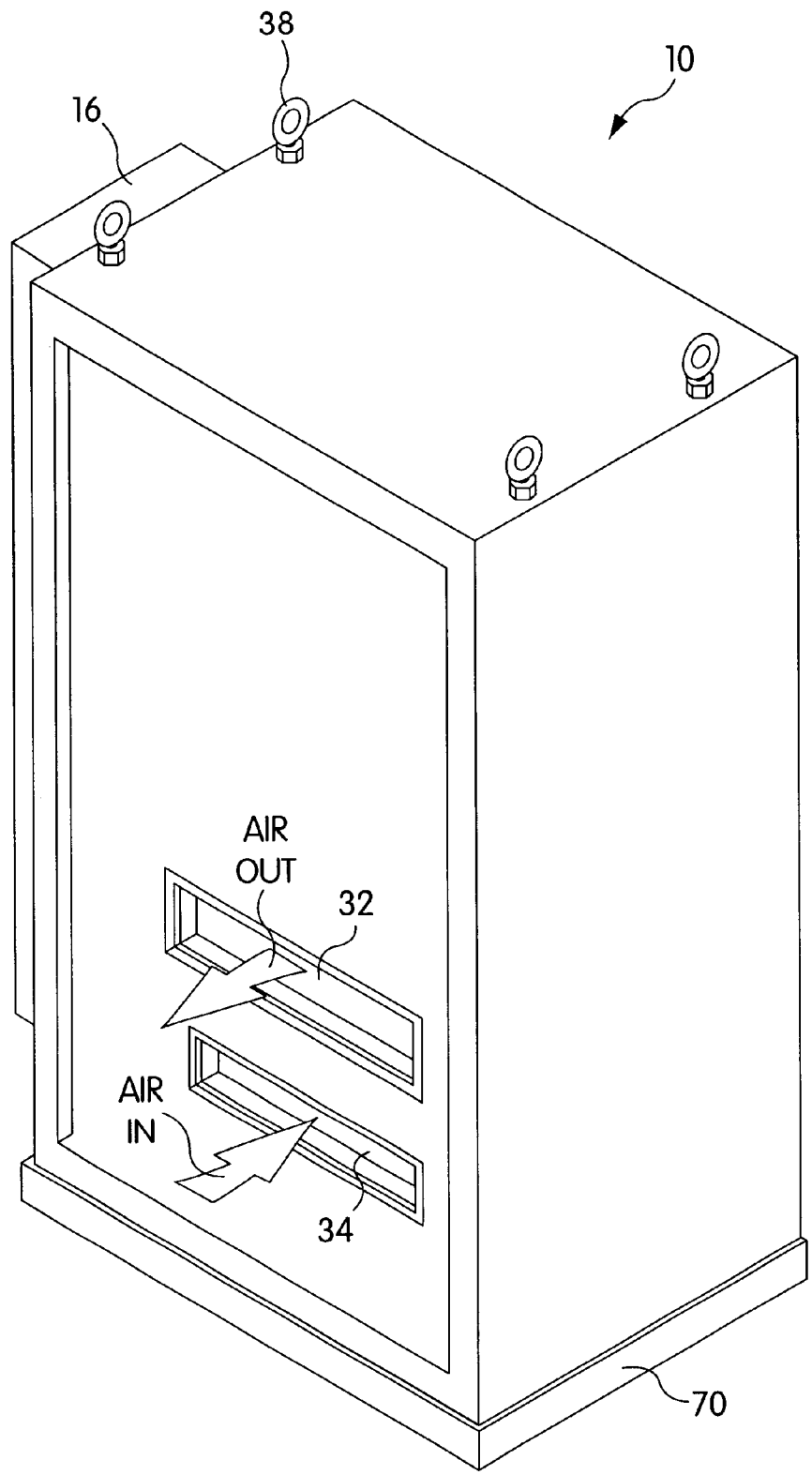
FIG. 3 is a rear perspective view of the enclosure shown in FIG. 1.

FIGS. 1–3 illustrate an enclosure 10 suitable for use in practicing the teachings of the invention. The enclosure has two side walls, a top and a bottom, which are formed as an integral structure for the preferred embodiment. If the side, top and bottom walls are not an integral structure, these walls would need to be attached in suitable manner and sealed as hereinafter discussed. A front panel 12 is removable, being shown both in its mounted position and its removed position in FIG. 1, panel 12 when removed providing access to enclosure 10. Suitable latches 13, for example twelve latches, are provided to secure panel 12 to the enclosure when mounted. Screws or bolts could also be used to perform this function. Panel 12 could also be a hinged door rather than totally removable. For some embodiments, rear panel 14 may also be hinged or removable. Enclosure 10 for the illustrative embodiment also has an I/O panel 16 mounted to its right side through which electrical, hydraulic, pneumatic, refrigerant or other connections may be made to the enclosure and to any commercial, off-the-shelf (COTS) components mounted therein. Connectors 18 on panel 16 provide an environmental seal both when exposed with caps and chains installed and when having a connector attached thereto. Panel 16 is mounted to enclosure 10 in a manner so as to provide an environmental seal with the enclosure so that moisture, environmental contaminants, etc cannot enter enclosure 10 through panel 16 and thermal leakage does not occur through this panel. Environmental seals are also preferably provided between any wires and lines which extend between panel 16 and enclosure 10 to further protect COTS electronics in the enclosure. Alternatively, electrical connections may be made through the walls of enclosure 10 either optically, with the walls of the enclosure being transparent in the relevant area, inductively, capacitively, or in some other manner not requiring an opening in an enclosure wall. Using inductive or capacitive couplings may prevent enclosure 10 from being fully electromagnetically shielded; however, this problem can be overcome by providing the shielding on the walls of panel 16 where it does not interfere with the inductive or capacitive coupling of electrical signals into the enclosure.

Referring to FIG. 2, it is seen that enclosure 10 has mounted therein an environmental control unit (ECU) 20 and a plurality of racks 22 in which circuit boards or other suitable electronic components may be mounted. A plurality of power supplies 24 may also be mounted in or adjacent to the rack, which supplies may be designed to operate from whatever power source is available on the vehicle or other site where the enclosure is to be used. The power supplies may thus convert battery power, generator power, power from an AC or DC line or other available power to electrical voltages/currents suitable for the COTS electronics. While controls for the ECU are generally integral therewith, an optional remote control unit 25, shown mounted under the power supplies, may sometimes be required. The location of power supplies 24 and control unit 25 may vary with application and either one or both may not be required for some applications.

Figure 4:
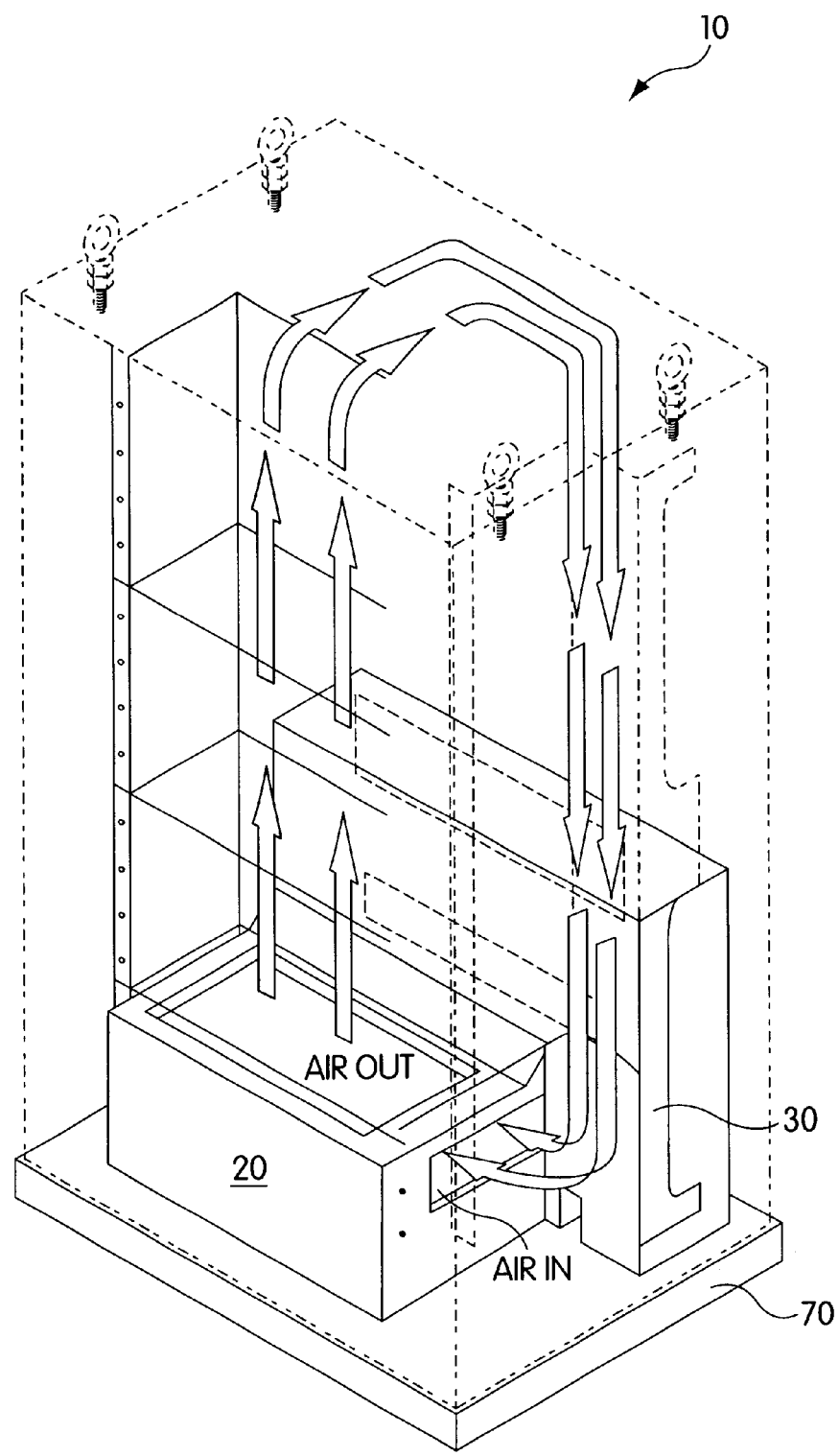
FIG. 4 is a semischematic front perspective view of the enclosure illustrating the airflow path for conditioned air flowing within the enclosure.

As may be seen in FIG. 4, and as discussed in greater detail later, ECU 20 has fans or other suitable components for moving a fluid sealed into the container through the ECU, where its temperature may be controlled, out the top of the ECU, through racks 22 to control the temperature of the COTS components and back through the side of the ECU opposite that where the power supplies 24 and control unit 25 are located. Alternatively, the return fluid may also be caused to flow over the power supplies and/or control unit to facilitate cooling thereof. Depending on ambient temperature, ECU 20 may merely circulate fluid to remove heat generated by the COTS components on for example circuit boards mounted in racks 22 or may heat or cool the fluid passing therethrough so as to facilitate operation over a wider range of environmental conditions.

While the fluid contained in enclosure 10 is typically air, in some applications a different gas or other fluid may be sealed in the enclosure to achieve better heat transfer or for other purposes. For example, a dry gas, such as dry nitrogen, might be utilized as the circulating fluid in enclosure 10 in order to eliminate the possibility of moisture or condensation occurring in the enclosure which could cause short circuits and/or contamination of the components mounted therein. An inert gas such as helium might also be preferable in some applications, and in some applications a dielectric fluid, for example a two-phase atomized fluid, which may for example be water droplets in air, may preferably be utilized. However, for most applications, the fluid circulated as shown in FIG. 4 would be air.

Figure 5:
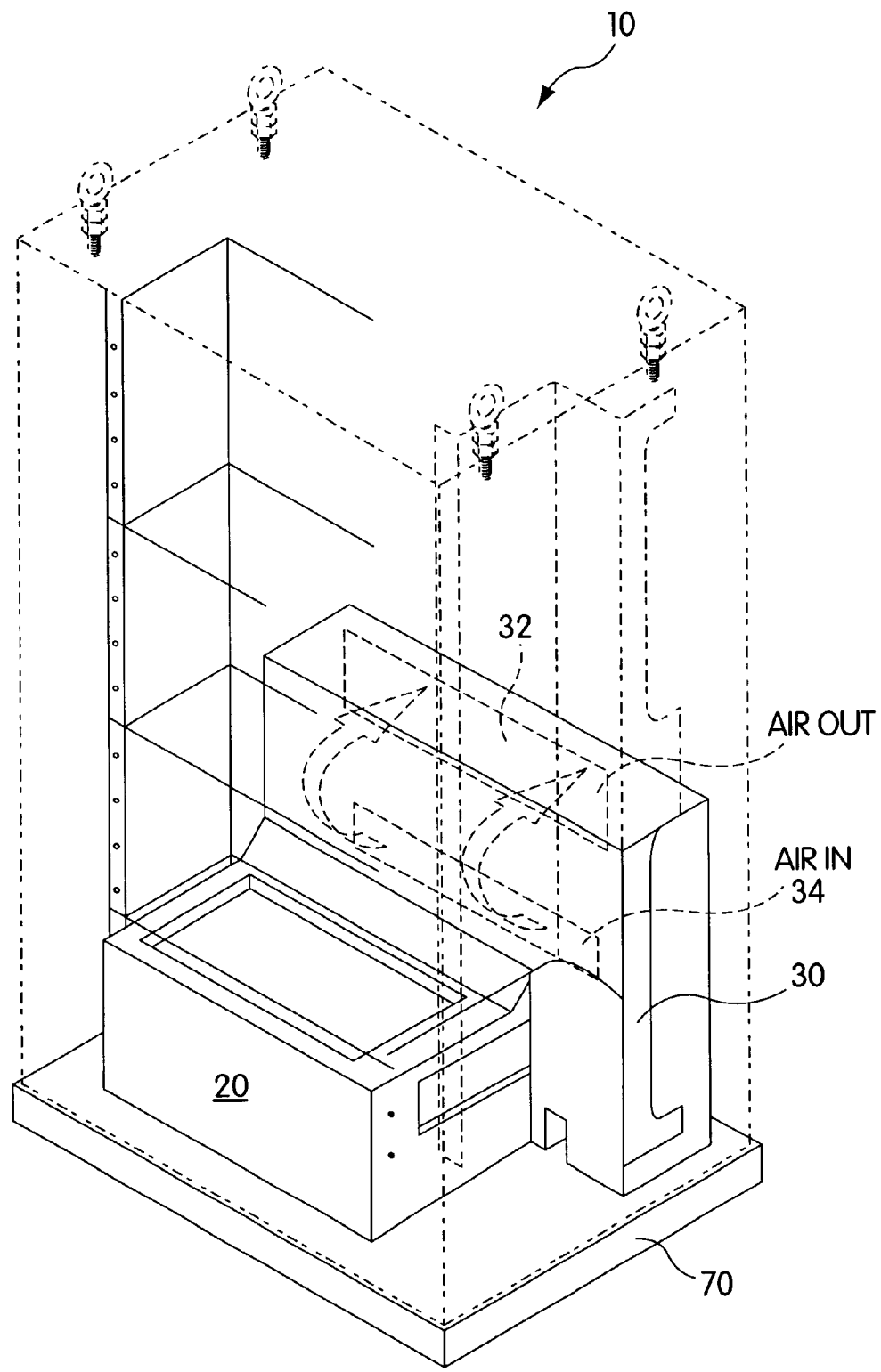
FIG. 5 is a semischemative front perspective view of the enclosure of FIG. 1 illustrating the airflow path for outside air.

Further, referring to FIGS. 3 and 5, it is seen that when the cooling mechanism of ECU 20 is a compressor or other mechanism requiring removal of heat therefrom, ambient air (or other ambient fluid) may be circulated through a channel 30 having an outlet 32 (FIG. 3) and an inlet 34. Channel 30 is completely isolated from the inside of enclosure 10 so that external air flowing through channel 30 in no way mixes with or contaminates the fluid in the enclosure. Channel 30 may be formed of or coated with a material which is resistant to salt or other environmental contaminants and all exposed surfaces of enclosure 10, including panels 12 and 14, may be formed of or coated with the same material. This permits the enclosure 10 to be utilized in harsh and contaminated environments, including marine environments, for extended periods of time without significant surface damage, and in particular without losing structural integrity.

While one advantage of the enclosure of this invention is that it is substantially lighter than prior art enclosures performing similar functions, the enclosure would still typically be relatively bulky and heavy, being, for an illustrative embodiment, over 40 inches high, over 26 inches wide without I/O panel 16 (and nearly 30 inches wide with the I/O panel) and being approximately 19 inches deep. For this illustrative embodiment, the weight of the enclosure is in a range from nearly 110 pounds to nearly 400 pounds, which is approximately half to two-thirds of the weight of comparable prior art enclosures which do not include all of the functional advantages of this invention. In view of the size and weight of the enclosure, four eyelets 38 are provided in the top of the enclosure and slots 40 are provided in an adapter base attached to the bottom of the enclosure to permit attachment of cables to the enclosure or to permit tines of a suitable forklift to be used for lifting the enclosure. Other suitable means known in the art may also be provided to facilitate the lifting and/or other movement of the enclosure including, for example, providing lockable wheels or casters on the bottom of the enclosure to facilitate movement thereof.

Door or panel 12 has a gasket 42 mounted on its inner side, which gasket co-acts with mating walls of the remainder of the enclosure to form both an environmental and electromagnetic seal. To the extent rear panel 14 is also removable, or to the extent the top, bottom, and side walls are not an integral structure, similar gaskets would be provided. Alternatively, other suitable means known in the art could be utilized for forming at least an environmental seal, and preferably both an environmental and EMF seal between each removable panel and the remainder of the enclosure. Where the enclosure is to be used underwater, the seals would also need to be waterproof, and other areas of the enclosure may also need to be waterproofed, including panel 16 and connectors 18.

All of the walls of enclosure 10, including the walls of removable panel 12 and panel 14 if also removable, contain thermal insulation 44 and preferably also contain EMF shielding material to both prevent any electromagnetic radiation from the COTS components on racks 22 from interfering with other components on the vehicle or other location where enclosure 10 is located and for preventing any environmental EMF radiation, caused for example by other components on a ship, plane or other vehicle, from interfering with the operation of the COTS components. For example, RFI (radio frequency interference) may be filtered to protect flight critical components in an aircraft environment. The thermal insulation, which may also enclose the ECU and/or racks 22, reduces the thermal burden on the ECU.

Figure 6A:
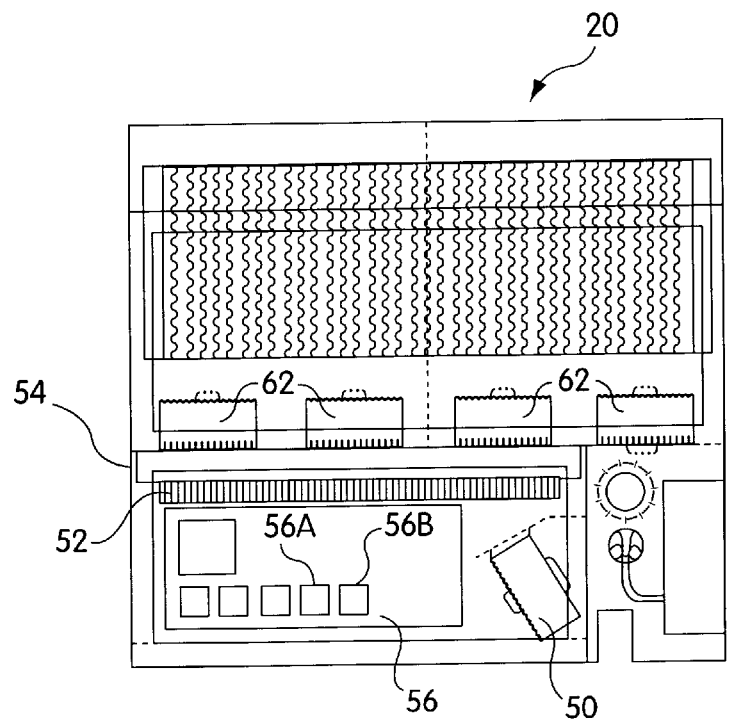
FIGS. 6A and 6B are a front view and a side view, respectively, of an environmental control unit (ECU) suitable for use in the enclosure of FIG. 1.
Figure 6B:
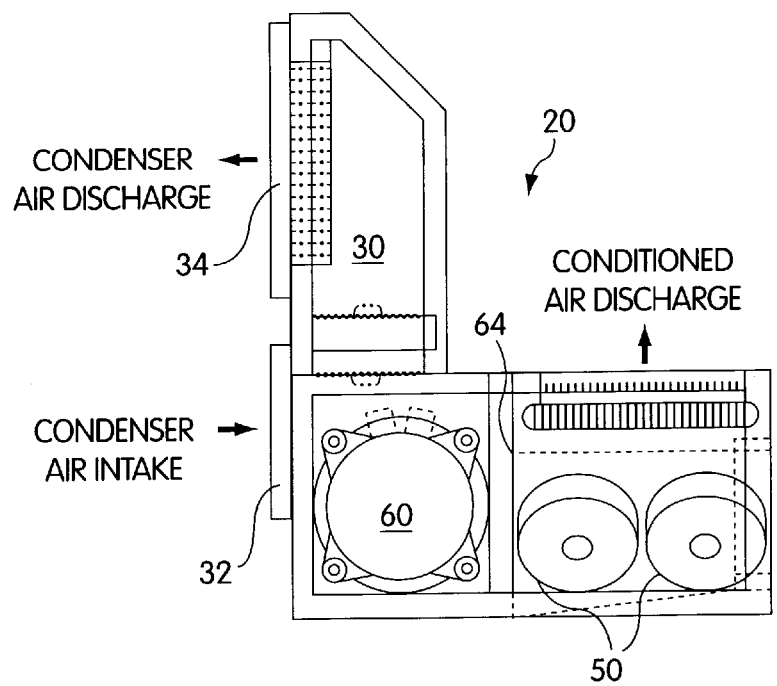

FIGS. 6A and 6B are two views of an exemplary ECU 20 which is generally suitable for use as the ECU 20 in the enclosure 10 of FIGS. 1–5, although it differs slightly from the schematic ECU representation shown in these earlier figures. In particular, air inside the enclosure is circulated by a pair of fans or blowers 50 which draw air into the ECU and cause it to flow in series over an evaporator coil 52 and a heater coil 54. Normally, only one of these two coils is operational at any given time, the air passing through the ECU being cooled if coil 52 is operational and the air passing through the ECU being heated if coil 54 is operational. So long as the temperature of the air flowing through the ECU, as detected by temperature sensor 56 is substantially within the normal range of operation for the COTS electronic, i.e. between +10° C. and +40° C., neither coil 52 nor coil 54 need to be operated, and the recirculating air itself can be relied upon to control heat generated by the electronics itself rather than from environmental causes. Temperature sensor 56 is positioned in the air path to detect the air temperature returning to the ECU, the output from the sensor being applied to a control for the ECU, which for example may be included as part of ECU control 25. Air, after passing through the evaporator coil and heater coil, is discharged into enclosure 10 and follows the path shown in FIG. 4 to both remove heat from the components in the racks and to maintain a desired ambient temperature in the enclosure which is within the normal operating range of the COTS electronics, regardless of the ambient temperature of the environment in which the enclosure is located. In particular, the cooling provided by evaporator coil 52 will permit operation up to a temperature of approximately 71° C. for an illustrative embodiment while the heating of coil 52 would permit operation down to a temperature of −54° C. for the illustrative embodiment. For this illustrative embodiment, temperature sensor 56 is divided into a first on/off temperature sensor switch 56A, for example a bimetallic switch, which is adjusted to close when the temperature rises above a predetermined threshold, for example 30° C. or 35° C., to assure that the temperature at the COTS components does not exceed the 40° C. for which they are designed. Similarly, a bimetallic switch 56B closes if the temperature drops below some predetermined threshold, for example 15° C. to 20° C., to activate heater coil 54 so that die temperature in the enclosure does not drop below the +10° C. minimum temperature at which the COTS electronics are designed to operate. When for example the temperature of the air passing over sensor 56 is between 15° C. and 35° C., neither switch is closed, resulting in substantially no change in the air temperature as it passes through ECU 20, The ECU also has an condenser 58 and a compressor 60 which are part of the cooling mechanism and which are the parts which may be heated during a cooling operation. Four blowers 62 are provided which pull external air (or other fluid) in through air intake 34 and pass the air over compressor 60 and through evaporator 58 to draw heat off these components before the air is exited through air outlet 32. The chambers through which the external air flows are isolated from the internal air flow path of the enclosure by a wall 64. As previously discussed, the walls of the chamber 30 through which external air flows may be formed of or coated with a material to minimize corrosion damage.

Another potential problem which enclosure 10 may be designed to deal with is where the environment in which it is operating is potentially explosive. Since any spark generated by an electrical component in such an environment could trigger an explosion, all potentially spark generating components in the enclosure 10, including relays, switches, blower motors, and the like, are hermetically sealed. Similarly, the compressor cooler shown in FIGS. 6A, 6B operates by circulating a refrigerant gas from compressor 60 through evaporator 52 to condenser 58 and back to compressor 60 in a standard closed circuit path. Since much of this refrigerant flow path passes through the enclosure, or at least through the portion of the ECU in the enclosure, there is a danger of the environment within the enclosure being contaminated by leaking refrigerant. To eliminate this problem, the refrigerant flow path may be hermetically sealed, and in particular all joints of this path may be so sealed.

The ECU controls may do several things to minimize both power usage and noise from ECU 20, thus reducing the power burden which the device places on the vehicle or other environment in which it is positioned. First, fans 62 need be operated only when switch 56A is closed to cause the system to be operating in a cooling mode. Second, the normal operating band is wide enough so that neither heating nor cooling is required for a fairly wide band of ambient temperatures. Good thermal insulation of the enclosure increases the external temperature band over which active heating/cooling within the enclosure is not required. Third, when the temperature switches detect a drop in temperature to for example 20° C., one of the air circulation fans 50 may for example be turned off to reduce air flow, permitting more heating of the air by the electronic circuitry. It is not desirable to cut off both fans 50 since some air circulation in the enclosure is desirable. More sophisticated control algorithms could also be implemented to further reduce energy used by the apparatus of this invention, and in particular the ECU thereof.

Further, while a dry gas could be used as previously indicated in enclosure 10 to eliminate potential moisture problems, in most applications, it is probably preferable to eliminate any moisture problem by removing moisture from the air trapped in the enclosure through use of suitable techniques known in the art, such as by a pump, capillary action, gravity flow, evaporative heaters, or the like from the evaporator to the condenser to be discharged in an external exhaust air. Such a moisture purge could be performed only when the enclosure is initially sealed or is resealed after the enclosure has been opened for some reason, may be performed each time the system is restarted, or could be performed at periodic intervals.

The final problem to be dealt with by enclosure 10 is vibration and shock. One way in which this problem is dealt with is that enclosure 10 is mounted on an adapter plate 70, which in turn may be secured to a suitable mount in the vehicle or the location where the enclosure is to be used. Standard shock mounts 72 may be positioned between enclosure 10 and mounting plate 70 to reduce or eliminate vibration. Such shock mounts may be springs, resilient shock absorbing pads or other shock absorbing mounts known in the art. Shock absorbing mounts may also be used between racks 22 and enclosure 10, either in addition to or instead of the mounts 72 previously mentioned. Other techniques for reducing shock and vibration to the racks 22 and/or the COTS components mounted therein could also be employed.

The enclosure should also be designed to maintain structural integrity during shock impulses encountered for example during a crash of an airborne or other vehicle to ensure crew safety and/or for other reasons, depending on application. Adapter plate 70 is also provided to allow for installation of the enclosure in a variety of locations for a variety of applications without requiring modification of the enclosure itself.

While the illustrative embodiment shows multiple racks of identical size, various commercial technologies and form factors could be installed in a variety of combinations. The multiplicity of power supplies enables redundancy for improved reliability and fault tolerance. Further, the multiplicity of power supplies also enables isolation of various electronics for electromagnetic compatibility as well as security reasons (e.g. red/black communications).

Thus, an apparatus has been provided for permitting standard COTS components to be utilized in environments for which such components are not designed including far greater temperature ranges than the components are designed for, greater pressure ranges, including high altitude operation, operation in environments containing salt spray and other potential contaminants, environments where the components will be exposed to vibration and shock, including shock impulses, explosive environments and environments containing EMF radiation. While fans or blowers 50,62 have been used to move air inside and outside the enclosure for the illustrative embodiment, other suitable components or mechanisms, including pumps, atomizers and other mechanisms known in the art, could be used to perform either function. The placement of the blowers or other air movers could also vary with application as could the placement of temperature sensor 56. Multiple temperature sensors and/or other sensor mechanisms may be utilized in some applications. Also, while specific cooler and heater mechanisms in the ECU have been discussed for the illustrative embodiment, other heating and cooling mechanisms, for example thermoelectric components or two phase evaporative cooling could be substituted in some applications. Thus, while the invention has been disclosed above with respect to a preferred embodiment, and numerous variations on such preferred embodiment have been mentioned, it is to be understood that such description is for purposes of illustration only, and that the foregoing and other changes in form and detail may be made in such embodiment by one skilled in the art while still remaining within the spirit and scope of the invention, which is to be defined only by the appended claims.

What is claimed is:

1. Apparatus for permitting commercial-off-the-shelf (COTS) electronics to be utilized in harsh environments for which said COTS electronics are not designed including:

an environmentally sealed enclosure;

mounts in said enclosure for holding said COTS electronics;

a temperature sensor within said enclosure;

an environmental control unit (ECU) in said enclosure, said ECU including a cooler which, when operated, cools fluid passing thereover, a heater which, when operated, heats fluid passing thereover, and controls, at least in part responsive to said temperature sensor, for selectively operating said cooler and said heater; and a mechanism for circulating fluid in said enclosure through said mounts and said ECU, the temperature of the fluid being appropriately controlled as it circulates through the ECU.

2. Apparatus as claimed in claim 1 wherein said cooler includes a compressor.

3. Apparatus as claimed in claim 2, wherein said enclosure includes a channel sealed from the remainder of the enclosure through which external air is circulated to cool said compressor.

4. Apparatus as claimed in claim 3, wherein said channel has walls of a corrosion resistant material.

5. Apparatus as claimed in claim 3, including a mechanism which circulates air through said channel at least when said compressor is being operated.

6. Apparatus as claimed in claim 5, wherein said mechanism which circulates air through said channel is turned off when said heater is operated.

7. Apparatus as claimed in claim 5, wherein said channel is closed when said heater is operated.

8. Apparatus as claimed in claim 1, wherein said enclosure has walls which are thermally insulated.

9. Apparatus as claimed in claim 1 wherein at least one of said ECU and said mounts is thermally insulated.

10. Apparatus as claimed in claim 1, including an adapter plate for mounting said enclosure, said adapter plate facilitating installation of an unmodified said enclosure in a variety of applications.

11. Apparatus as claimed in claim 1, including a mechanism for inhibiting vibration of said COTS electronics.

12. Apparatus as claimed in claim 11, including an adapter plate for mounting said enclosure, said mechanism for inhibiting vibration including shock mounts between the adapter plate and the enclosure.

13. Apparatus as claimed in claim 11, wherein said mechanism for inhibiting vibration includes shock mounts between said mounts and said enclosure.

14. Apparatus as claimed in claim 1, wherein said enclosure has a removable panel through which access to the enclosure is provided, said panel being attached and sealed to the remainder of the enclosure when the apparatus is in use.

15. Apparatus as claimed in claim 1 wherein said fluid is a gas.

16. Apparatus as claimed in claim 15 wherein said gas is air.

17. Apparatus as claimed in claim 15 including a mechanism for removing moisture from said gas.

18. Apparatus as claimed in claim 17 wherein said mechanism is operative at least on start up to remove moisture from the enclosure.

19. Apparatus as claimed in claim 15 wherein said gas is a dry gas, substantially eliminating moisture from said enclosure.

20. Apparatus as claimed in claim 1 wherein said apparatus is sealed to operate in an explosive environment.

21. Apparatus as claimed in claim 20 including a hermetic seal enclosing each element in said enclosure which might potentially generate a spark.

22. Apparatus as claimed in claim 1 wherein said temperature sensor includes at least one on/off switch.

23. Apparatus as claimed in claim 22 wherein said temperature sensor includes a first on/off switch for controlling said cooler and a second on/off switch for controlling said heater.

24. Apparatus as claimed in claim 23 wherein said on/off switches are bimetallic switches.

25. Apparatus as claimed in claim 1 wherein said cooler utilizes a fluid refrigerant flowing through piping, and wherein said piping is hermetically sealed.

26. Apparatus as claimed in claim 1 wherein said sealed enclosure is scaled to inhibit electromagnetic radiation passing therethrough in either direction.

27. Apparatus as claimed in claim 1 including an RFI filter on said ECU.

28. Apparatus as claimed in claim 1 wherein said ECU includes controls for reducing at least one of power usage and acoustic noise.

29. Apparatus as claimed in claim 1 wherein said mounts are racks adapted for holding a plurality of electronic components.

30. Apparatus as claimed in claim 1 wherein said enclosure is designed to maintain structural integrity under shock impulse.

* * * * *

UNITED STATES PATENT AND TRADEMARK OFFICE
CERTIFICATE OF CORRECTION

PATENT NO.     : 6,330,152 B1
DATED          : December 11, 2001
INVENTOR(S)    : David L. Vos et al.

It is certified that error appears in the above-identified patent and that said Letters Patent is hereby corrected as shown below:

<u>Title page,</u>
Insert Item -- [73] Assignee: Lockheed Martin Corporation, Bethesda, Maryland --

Signed and Sealed this

Eleventh Day of February, 2003

JAMES E. ROGAN
*Director of the United States Patent and Trademark Office*